United States Patent [19]

Kimura et al.

[11] Patent Number: 6,044,214

[45] Date of Patent: Mar. 28, 2000

[54] FAULT SIMULATION METHOD OPERABLE AT A HIGH SPEED

[75] Inventors: Takashi Kimura; Takumi Kaite, both of Ishikawa; Takahisa Nakako; Eiji Harada, both of Tokyo, all of Japan

[73] Assignee: NEC Corporation, Tokyo, Japan

[21] Appl. No.: 09/057,505

[22] Filed: Apr. 9, 1998

[30] Foreign Application Priority Data

Apr. 10, 1997 [JP] Japan .................................. 9-092245

[51] Int. Cl.$^7$ .................................................. G06F 9/455
[52] U.S. Cl. .............................. 395/500.36; 395/500.05; 714/25; 714/28
[58] Field of Search ................ 395/500.35, 500.36, 395/500.37, 500.02; 371/22.1, 23; 714/25, 28

[56] References Cited

U.S. PATENT DOCUMENTS

| 4,937,765 | 6/1990 | Shupe et al. ............................. 702/187 |
| 5,410,548 | 4/1995 | Millman .................................... 371/23 |
| 5,684,808 | 11/1997 | Valind ........................................... 1/1 |
| 5,862,149 | 1/1999 | Carpenter et al. ..................... 371/22.3 |

FOREIGN PATENT DOCUMENTS

| 64-46846 | 2/1989 | Japan . |
| 3-179567 | 8/1991 | Japan . |

OTHER PUBLICATIONS

Vinnakota et al., "Functional Test Generation for FSMs by Fault Extraction", 31st ACM/IEEE Design Automation Conference, 1994, p. 712–716.

Japanese Office Action dated Jul. 27, 1999 with partial translation.

Mao et al, "Improving Gate Level Fault Coverage by RTL Fault Grading", IEEE Proceedings of the Oct. 1996 Test Conference, pp. 150–159.

Froessl et al, "A New Model to Uniformly Represent the Function and Timing of MOS Circuits and its Application to VHDL Simulation", IEEE Feb. 1994 Proceedings of the European Design and Test Conference, pp. 343–348.

Joobbani, "Functional–Level Fault Simulation", Proceedings, IEEE International Conference on Circuits and Computers, 1980, pp. 1120–1124.

Japanese Office Action dated Oct. 20, 1999 with Partial Translation.

*Primary Examiner*—Kevin J. Teska
*Assistant Examiner*—Samuel Broda
*Attorney, Agent, or Firm*—McGinn & Gibb, P.C.

[57] ABSTRACT

A fault simulation method for simulating an entire circuit represented by a gate model, comprises the steps of preparing a plurality of fault circuits represented by gate models, which are equal in number to the number of internal faults, with the internal faults assumed in the entire circuit, of dividing each of the fault circuits into a plurality of partial circuits each of which is represented by the gate model, of replacing internal faults in the partial circuits with external faults out of the partial circuits that are equivalent to the internal faults; of translating the partial circuits into translated partial circuits represented by superior models which have operation speed faster than that of the gate models, and of simultaneously simulating both of a good circuit represented by the superior model and the fault circuits represented by the superior models to determine whether or not the internal faults can be detected by comparing results of simulations. The method further may comprise a step of calculating a fault coverage for the entire circuit by repeating the above-mentioned simultaneously simulating step by the number of patterns.

14 Claims, 8 Drawing Sheets

CONVERSION INTO EQUIVALENT CKT

TRANSLATING INTO SUPERIOR MODEL OPERABLE AT A HIGH SPEED

FAULT SIMULATION METHOD OPERABLE AT A HIGH SPEED

BACKGROUND OF THE INVENTION

This invention relates to a computer aided design (CAD) for designing integrated circuits such as large-scale integrated circuits (LSIs) or logic circuits and, more particularly, to a fault simulation method for checking whether or not any fault can be detected in a designed integrated circuit.

As known in the art, a "fault simulation" is to check whether or not any fault can be detected in the designed integrated circuit by generating a test pattern for checking whether or not the designed integrated circuit satisfies a predetermined performance and/or a predetermined function and by carrying out simulation, using the generated test pattern, behavior of the designed integrated circuit including faults. In other words, although a test program is used to verify validity in a completed LSI or logic circuit, the "fault simulation" is used to check a fault coverage for all of faults in a checked object by the test program and to confirm validity of the test program.

In prior art, the fault simulation carries out first a good simulation on the integrated circuit having no fault and subsequently carries out simulations on the integrated circuit having each fault. As a result, the fault simulation takes a very long processing time in comparison with a logic simulation.

Now, models of several levels are used as an unit of the simulation. That is, there are a model of switch level (which will be referred to as a "switch model"), a model of gate level (which will be called a "gate model"), and a model of function level (which will be referred to as a "function model"). The "switch model" is a most primitive model and deals with a transfer gate or the like in a metal oxide semiconductor (MOS) circuit. In addition, the "gate model" deals with basic gates such as an AND gate, an OR gate and so on. Furthermore, the "function model" deals with a higher model than the gate model. The function model is referred to as a superior model. The superior model has an operation speed which is faster than that of the gate model. In other words, the superior model is operable at a higher speed than that of the gate model.

A conventional fault simulation method is published in Japanese Unexamined Patent Publication of Tokkai No. Sho 64-46,846 or JP-A 64-46,846 (which will be herein called a reference) on Feb. 21, 1989 which is hereby incorporated herein by reference. The fault simulation method according to JP-A 64-46,846 comprises the steps of dividing an entire circuit into a plurality of partial circuits, of representing the partial circuits by superior models operable at a high speed except for a particular one thereof, and of carrying out simulation of faults. That is, the conventional fault simulation method uses the gate model operable at a low speed as the particular partial circuit where any fault is assumed or defined to perform operation on the particular partial circuit. Such a fault simulation is called a hierarchical fault simulation. In the hierarchical fault simulation, it is possible to perform propagation of the fault by representing the particular partial circuit by the gate model and by representing remaining partial circuits where the fault propagates by the superior models.

More specifically, in the hierarchical fault simulation, each partial circuit is preliminarily represented by both of the gate model and the superior model and switching operation is made so as to select, as the particular partial circuit, the partial circuit represented by the gate model and to select, as the remaining partial circuits, the partial circuits represented by the superior models. As described above, on simulation, the hierarchical fault simulation deals with a circuit arrangement where the particular partial circuit represented by the gate model and the remaining partial circuits represented by the higher superior models are mixed. In addition, the superior model may be, for example, C-like description.

At any rate, the hierarchical fault simulation method carries out simulation with the particular partial circuit represented by the gate model and the remaining partial circuits represented by the superior models mixed. As described above, inasmuch as the particular partial circuit where the fault is assumed is represented by the gate model in the conventional fault simulation method, the conventional fault simulation is disadvantageous in that it is impossible to operate the particular partial circuit at the high speed.

SUMMARY OF THE INVENTION

It is therefore an object of this invention to provide a fault simulation method, which is capable of operating at a high speed.

Other objects of this invention will become clear as the description proceeds.

The present inventors consider that difficulty in operating at the high speed in the conventional fault simulation is caused by existence of the particular partial circuit represented by the gate model and therefore a fault simulation can be operable at the high speed if all of the partial circuits are represented by the superior models. Accordingly, the present inventors zealously investigate to find out a method of representing all of the partial circuits by the superior models although any fault is assumed or defined in any partial circuit. As a result of this investigation, the present inventors arrive at an idea that all of the partial circuits can be represented by the superior models if an internal fault in a partial circuit is replaced with an external fault out of the partial circuit that is equivalent to the internal fault.

According to an aspect of this invention, a method for fault simulation comprises a first step of preparing a plurality of fault circuits represented by gate models, which are equal in number to the number of faults, with the faults assumed in an entire circuit represented by a gate model, a second step of dividing each of the fault circuits represented by the gate models into a plurality of partial circuits each of which is represented by the gate model, a third step of replacing internal faults in the partial circuits represented by the gate models with external faults out of the partial circuits that are equivalent to the internal faults, a fourth step of translating the partial circuits represented by the gate models with translated partial circuits represented by superior models which have operation speed faster than that of said gate models, and a fifth step of simultaneously simulating both of a good circuit represented by the superior model and the fault circuits represented by the superior models to determine whether or not the faults can be detected by comparing results of simulations.

The above-mentioned method for fault simulation further may comprise a six step of calculating a fault coverage for the entire circuit by repeating the above-mentioned fifth step by the number of patterns.

A recording medium to which this invention is applicable is for recording a program to make a computer execute fault simulation for an entire circuit.

According to another aspect of this invention, the above-mentioned recording medium is for recording the program to make the computer execute a first processing of preparing a plurality of fault circuits represented by gate models, which are equal in number to the number of faults, with the faults assumed in the entire circuit represented by a gate model, a second processing of dividing each of the fault circuits represented by the gate models into a plurality of partial circuits each of which is represented by the gate model, a third processing of replacing internal faults in the partial circuits represented by the gate models with external faults out of the partial circuits that are equivalent to the internal faults, a fourth processing of translating the partial circuits represented by the gate models with translated partial circuits represented by superior models which have operation speed faster than that of the gate models, and a fifth processing of simultaneously simulating both of a good circuit represented by the superior model and the fault circuits represented by the superior models to determine whether or not the faults can be detected by comparing results of simulations.

The afore-mentioned recording medium further may make the computer execute a six processing of calculating a fault coverage for the entire circuit by repeating the above-mentioned fifth processing by the number of patterns.

DESCRIPTION OF THE PREFERRED EMBODIMENT

Figure 1:
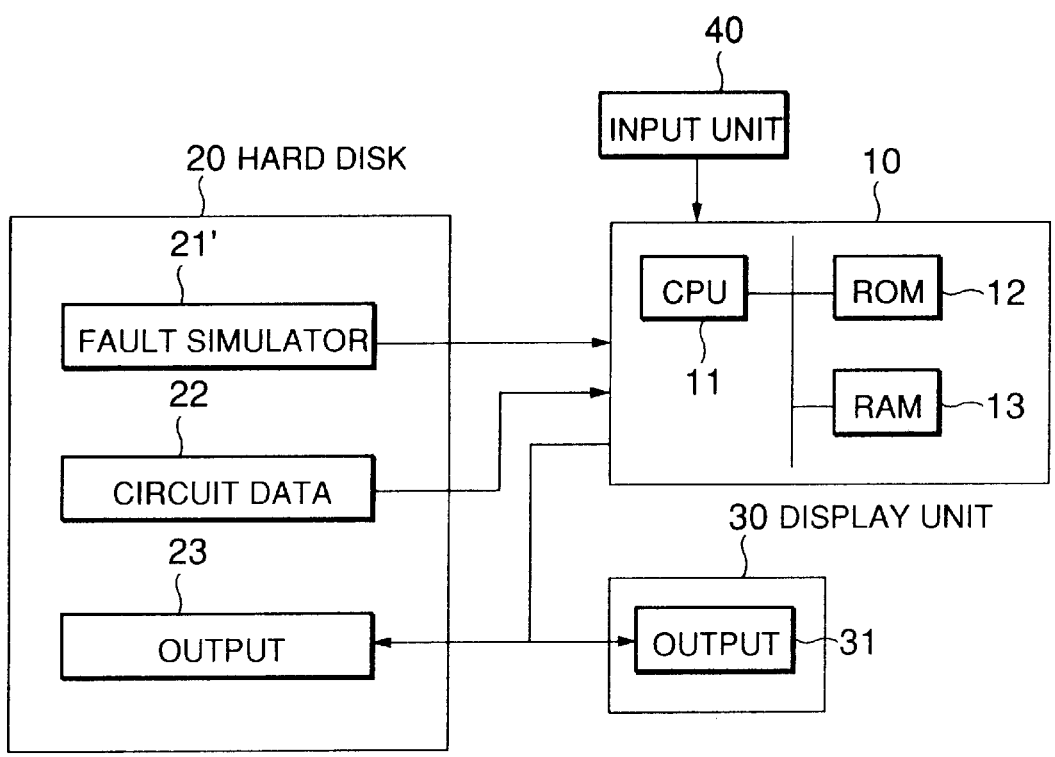
FIG. 1 is a block diagram of hardware (a fault simulation system) for realizing a conventional fault simulation method.
Figure 2:
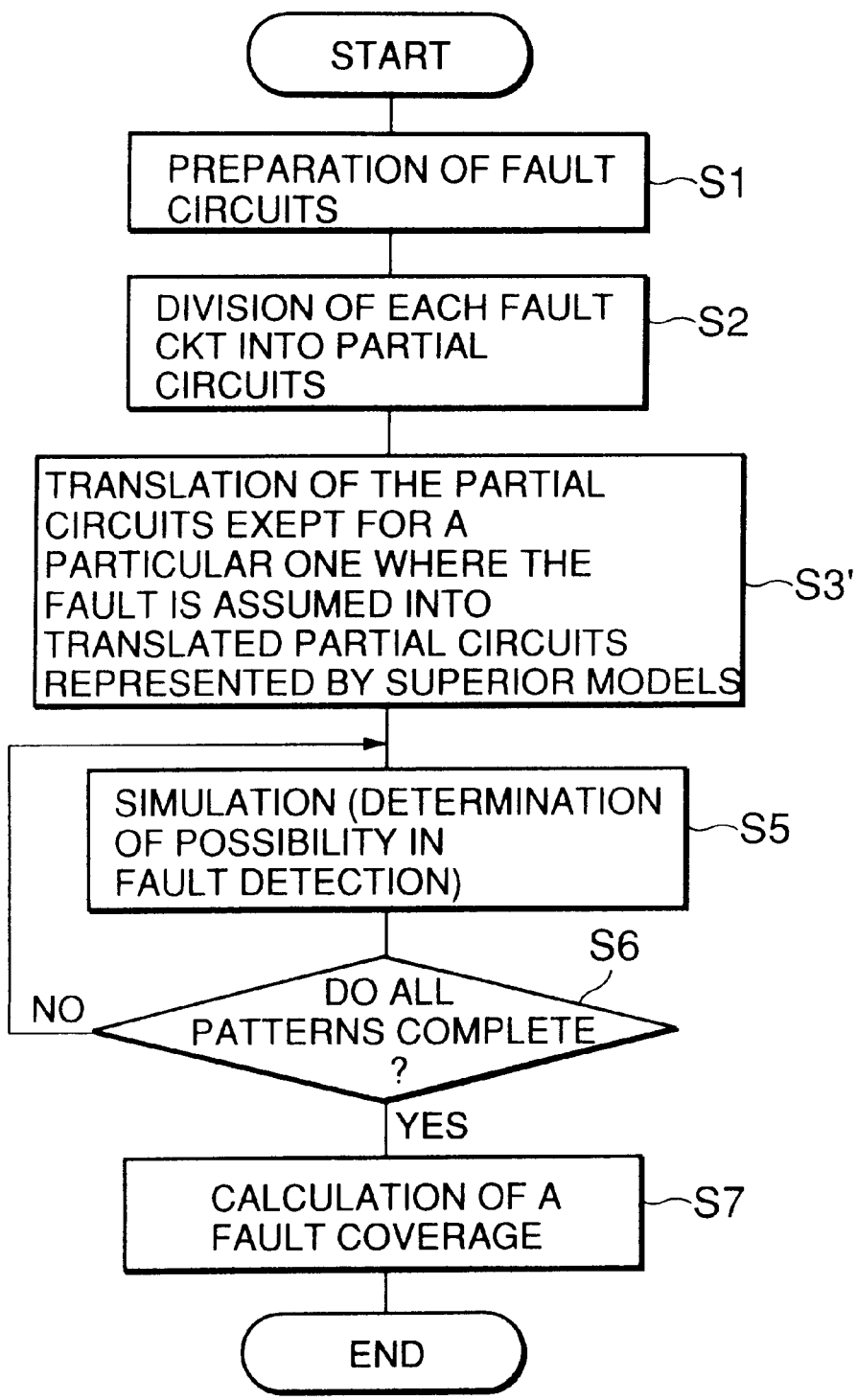
FIG. 2 is a flow chart for use in describing the conventional fault simulation method.
Figures 3A, 3B:
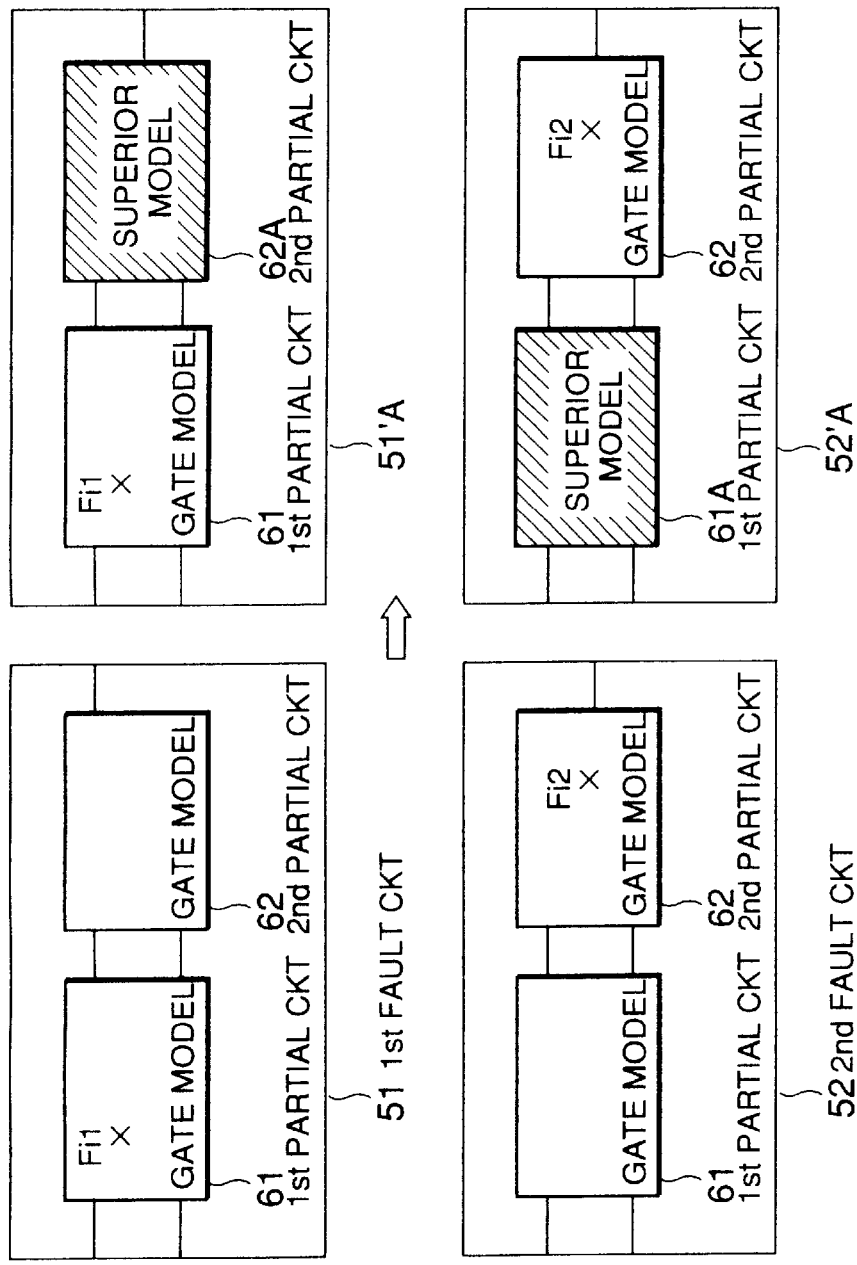
FIGS. 3A and 3B collectively show views for use in describing an operation at steps S1 to S3' in FIG. 2.

Referring to FIGS. 1, 2, 3A and 3B, a conventional fault simulation method will be described at first for a better understanding of this invention. FIG. 1 is a block diagram showing hardware (a fault simulation system) for realizing the conventional fault simulation method. FIG. 2 is a flow chart for use in describing the conventional fault simulation method. FIGS. 3A and 3B collectively show views for use in describing an operation at steps S1 to S3' in FIG. 2.

As shown in FIG. 1, the fault simulation system comprises a computer 10, a hard disk 20 serving as an auxiliary storage unit, a display unit 30 acting as an output unit, and an input unit 40. The computer 10 is connected to the hard disk 20, the display unit 30, and the input unit 40. The display unit 30 may be a cathode ray tube (CRT) display device or a liquid crystal display unit. The input unit 40 may be a keyboard or a pointing device such as a mouse.

The hard disk 20 comprises first through third storage areas 21', 22, and 23. The first storage area 21' is a storage area for storing a conventional fault simulator which is a program equivalent to the flow chart illustrated in FIG. 2. The second storage area 22 is a storage area for storing circuit data indicative of an entire circuit which should be simulated by the conventional fault simulator. The entire circuit may be an integrated circuit such as a logic circuit or a large-scale integrated circuit (LSI). The third storage area 23 is a storage area for storing output data indicative of a simulated result by the fault simulation system.

The display unit 30 has a screen 31 for visually displaying the output data. The input unit 40 is for inputting a command to make the computer 10 execute the fault simulator stored in the first storage area 21' of the hard disk 20.

As shown in FIG. 1, the computer 10 comprises a central processing unit (CPU) 11, a read-only memory (ROM) 12, and a random access memory 13. The read-only memory 12 stores a control program for controlling operation in the central processing unit 11. The random access memory 13 serves as a main storage unit for storing an application program and data. The central processing unit 11 carries out data processing on the data in accordance with the control program and the application program stored in the read-only memory 12 and the random access memory 13.

Description will be made about an operation of the fault simulation system illustrated in FIG. 1.

When the input unit 40 inputs the command to the computer 10, the random access memory 13 of the computer 10 is loaded with, as the application program, the conventional fault simulator stored in the first storage area 21' of the hard disk 20. Loaded to the random access memory 13, the conventional fault simulator requires the hard disk 20 to send the circuit data stored in the second storage area 22 of the hard disk 20 to the random access memory 13. As a result, the random access memory 13 of the computer 10 is loaded with the circuit data stored in the second storage area 22 of the hard disk 20. The central processing unit 11 carries out processing on the circuit data in accordance with the conventional fault simulator in the manner which will later be described in conjunction with FIG. 2. The central processing unit 11 produces the output data indicative of a result of simulation. The output data is stored in the third storage area 23 of the hard disk 20 and is visually displayed on the screen 31 of the display unit 30.

Referring to FIGS. 2, 3A, and 3B, the description will proceed to operation of the conventional fault simulation method.

At a step S1, the central processing unit 11 assumes or defines internal faults in the entire circuit represented by a gate model to prepare fault circuits which are equal in number to the internal faults and which are represented by gate models, as shown in FIG. 3A. In the example being illustrated in FIG. 3A, first and second internal faults Fi1 and Fi2 are assumed or defined as the internal faults and the central processing unit 11 prepares, as first and second fault circuits 51 and 52, the entire circuits which include the first and the second internal faults Fi1 and Fi2, respectively. The step S1 is followed by a step S2 at which the central processing unit 11 divides each fault circuit into a plurality of partial circuits each of which is represented by the gate model. In the example being illustrated in FIG. 3A, the central processing unit 11 divides each fault circuit into first and second partial circuits 61 and 62. In addition, the first fault circuit 51 is a fault circuit where the first internal fault Fi1 is included in the first partial circuit 61 while the second fault circuit 52 is a fault circuit where the second internal fault Fi2 is included in the second partial circuit 62.

The step S2 is succeeded by a step S3' at which the central processing unit 11 translates the partial circuits except for a particular partial circuit where the fault is assumed into translated partial circuits each of which is represented by a superior model operable at a higher speed than that of the gate model, as shown in FIG. 3B. In the example being illustrated in FIG. 3B, in a case of the first fault circuit 51'A, the second partial circuit 62 only is translated into a translated second partial circuit 62A represented by the superior model with the first partial circuit 61 represented by the gate model as it is. This is because there is the first internal fault Fi1 in the first partial circuit 61. In addition, in a case of the second fault circuit 52'A, the first partial circuit 61 only is translated into a translated first partial circuit 61A represented by the superior model with the second partial circuit 62 represented by the gate model as it is. This is because there is the second internal fault Fi2 in the second partial circuit 62.

The following is reason why the particular partial circuit where the fault is assumed is not represented by the superior model although only the remaining partial circuits except for the particular partial circuit are represented by the superior model. That is, the superior model does not have detailed internal description in the manner as the gate model and it is therefore impossible to assume a fault corresponding to the internal fault in the gate model inside the superior model. As a result, the partial circuit represented by the gate model is used as the particular partial circuit where the fault is assumed as it is.

The step S3' proceeds to a step S5 at which the central processing unit 11 carries out simulation on a good circuit (which is the entire circuit having no fault and which is represented by the superior model) and all of the fault circuits to determine whether or not any fault can be detected by comparing among simulated results. After this processing in the step S5 is repeatedly performed by the number of patterns (step S6), the central processing unit 11 calculates a fault coverage in the entire circuit (step S7).

As described above, the conventional fault simulation method uses the gate model operable at a low speed as the particular partial circuit where any fault is assumed or defined to perform operation on the particular partial circuit. Such a fault simulation is called a hierarchical fault simulation. In the hierarchical fault simulation, it is possible to perform propagation of the fault by representing the particular partial circuit by the gate model and by representing remaining partial circuits where the fault propagates by the superior models.

More specifically, in the hierarchical fault simulation, each partial circuit is preliminarily represented by both of the gate model and the superior model and switching operation is made so as to select, as the particular partial circuit, the partial circuit represented by the gate model and to select, as the remaining partial circuits, the partial circuits represented by the superior models. As described above, on simulation, the hierarchical fault simulation deals with a circuit arrangement where the particular partial circuit represented by the gate model and the remaining partial circuits represented by the superior models are mixed. In addition, the superior model may be, for example, C-like description.

At any rate, the hierarchical fault simulation method carries out simulation with the particular partial circuit represented by the gate model and the remaining partial circuits represented by the superior models mixed. As described above, inasmuch as the particular partial circuit where the fault is assumed is represented by the gate model in the conventional fault simulation method, the conventional fault simulation is disadvantageous in that it is impossible to operate the particular partial circuit at the high speed, as mentioned in the preamble of the instant specification.

Figure 4:
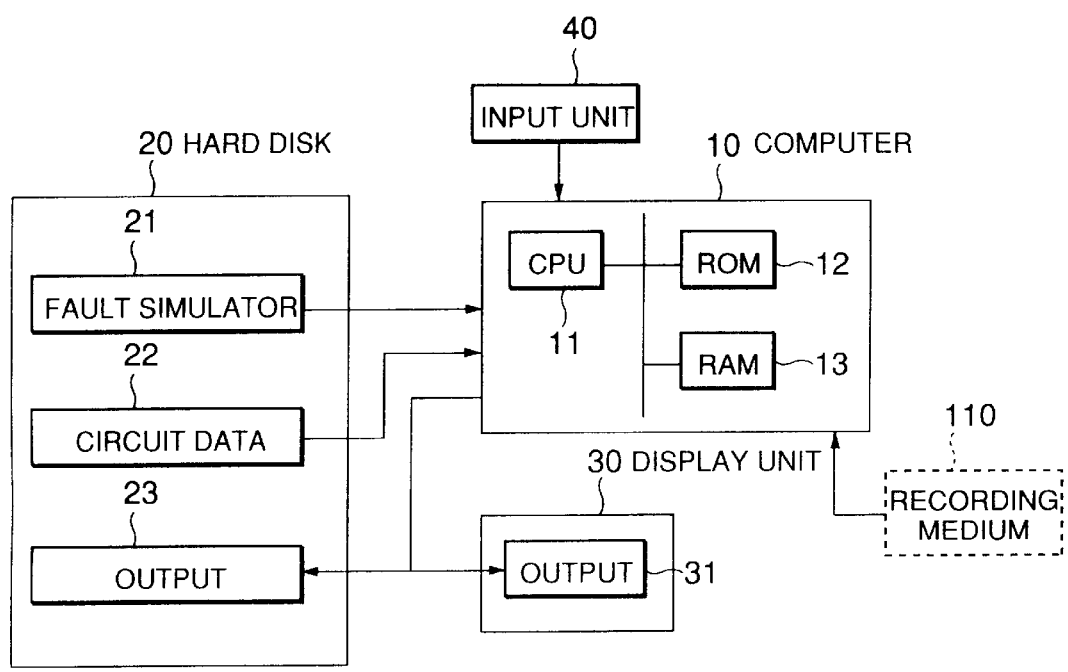
FIG. 4 is a block diagram showing hardware (a fault simulation system) for realizing a fault simulation method according to a preferred embodiment of this invention.
Figure 5:
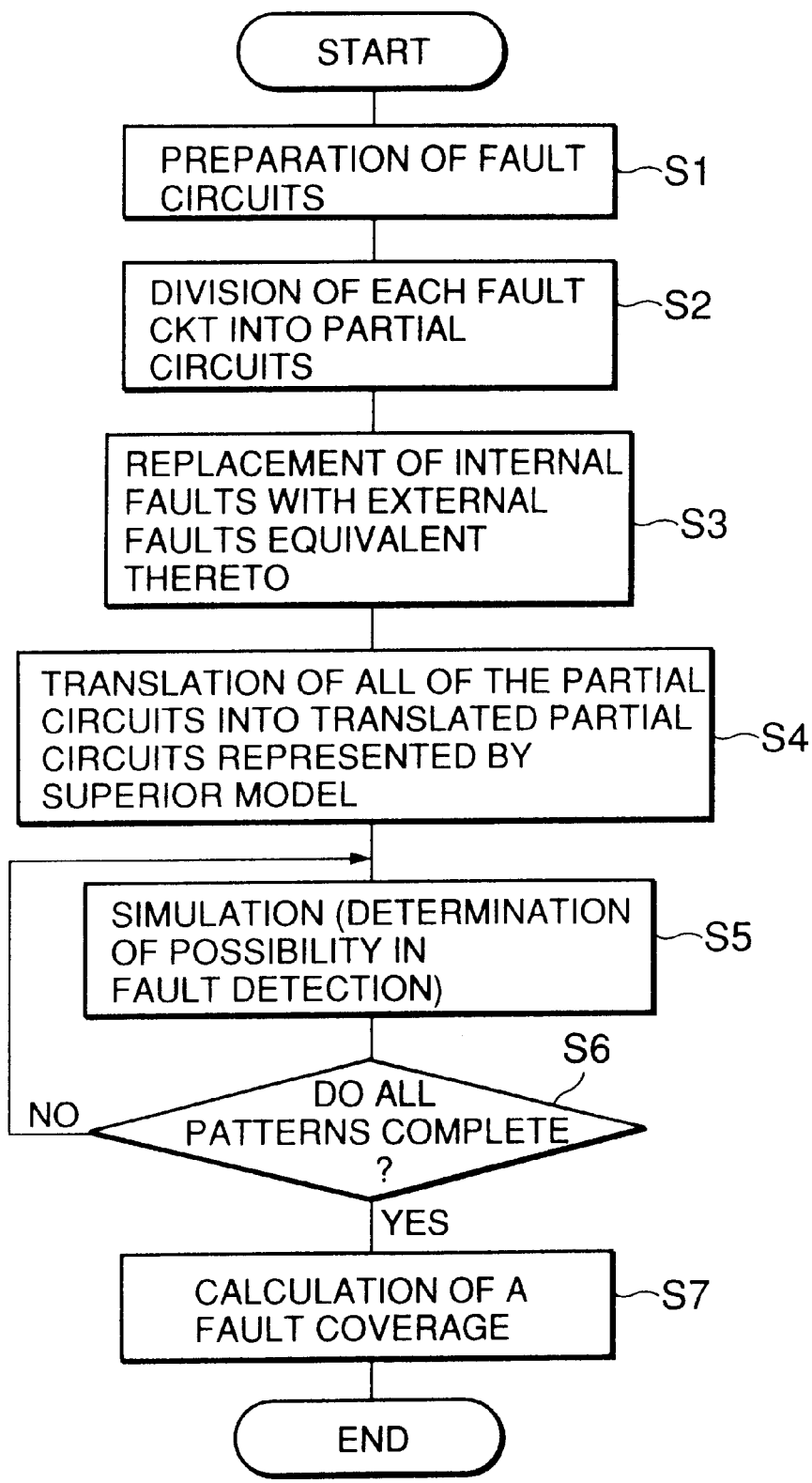
FIG. 5 is a flow chart for use in describing the fault simulation method according to the preferred embodiment of this invention.
Figures 6A, 6B:
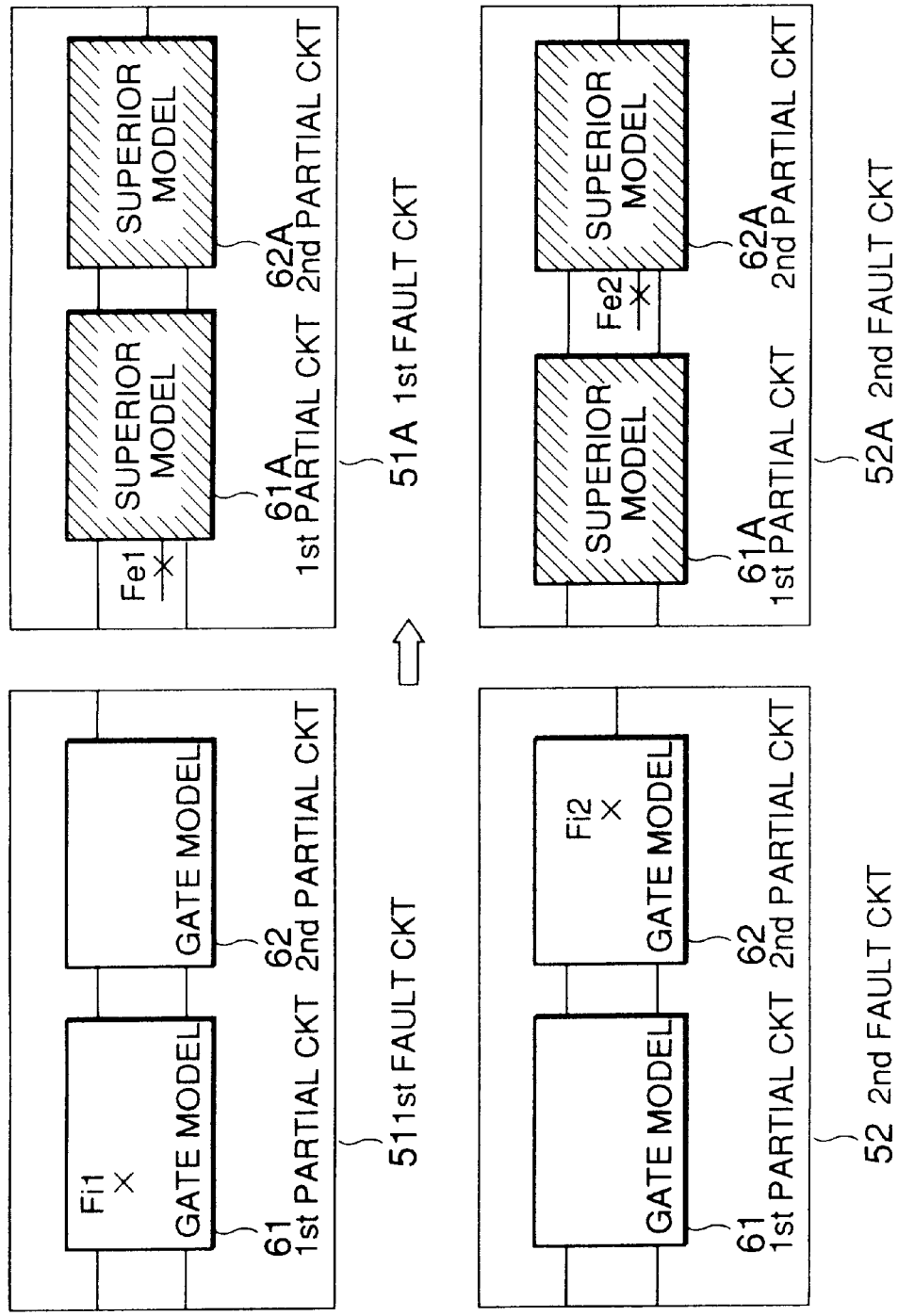
FIGS. 6A and 6B collectively show views for use in describing an operation at steps S1 to S4 in FIG. 5.

Referring to FIGS. 4, 5, 6A and 6B, the description will proceed to a fault simulation method according to a preferred embodiment of this invention. FIG. 4 is a block diagram showing hardware (a fault simulation system) for realizing the fault simulation method according to the preferred embodiment of this invention. FIG. 5 is a flow chart for use in describing the fault simulation method according to the preferred embodiment of this invention. FIGS. 6A and 6B collectively show views for use in describing an operation at steps S1 to S4 in FIG. 5.

As shown in FIG. 4, the fault simulation system is similar in structure and operation to the conventional fault simulation system illustrated in FIG. 1 except that the fault simulator stored in the first storage area of the hard disk is modified from that illustrated in FIG. 1 as will later become clear. The first storage area is therefore depicted at 21.

That is, the fault simulation system comprises the computer 10, the hard disk 20 serving as the auxiliary storage unit, the display unit 30 acting as the output unit, and the input unit 40. The computer 10 is connected to the hard disk 20, the display unit 30, and the input unit 40. The display unit 30 may be the cathode ray tube (CRT) display device or the liquid crystal display unit. The input unit 40 may be the keyboard or the pointing device such as the mouse.

The hard disk 20 comprises the first through the third storage areas 21, 22, and 23. The first storage area 21 is the storage area for storing a fault simulator according to the preferred embodiment of this invention that is a program equivalent to the flow chart illustrated in FIG. 5. The second storage area 22 is the storage area for storing circuit data indicative of the entire circuit which should be simulated by the fault simulator. The entire circuit may be the integrated circuit such as the logic circuit or the large-scale integrated circuit (LSI). The third storage area 23 is the storage area for storing output data indicative of a simulated result by the fault simulation system.

The display unit 30 has the screen 31 for visually displaying the output data. The input unit 40 is for inputting the command to make the computer 10 execute the fault simulator stored in the first storage area 21 of the hard disk 20.

As shown in FIG. 4, the computer 10 comprises the central processing unit (CPU) 11, the read-only memory (ROM) 12, and the random access memory 13. The read-only memory 12 stores the control program for controlling operation in the central processing unit 11. The random access memory 13 serves as the main storage for storing the application program and data. The central processing unit 11 carries out data processing on the data in accordance with the control program and the application program stored in the read-only memory 12 and the random access memory 13.

Description will be made about an operation of the fault simulation system illustrated in FIG. 4.

When the input unit 40 inputs the command to the computer 10, the random access memory 13 of the computer 10 is loaded with, as the application program, the fault simulator stored in the first storage area 21 of the hard disk 20. Loaded to the random access memory 13, the fault simulator requires the hard disk 20 to send the circuit data stored in the second storage area 22 of the hard disk 20 to the random access memory 13. As a result, the random access memory 13 of the computer 10 is loaded with the circuit data stored in the second storage area 22 of the hard disk 20. The central processing unit 11 carries out processing on the circuit data in accordance with the conventional fault simulator in the manner which will later be described in conjunction with FIG. 5. The central processing unit 11 produces the output data indicative of the simulated result. The output data is stored in the third storage area 23 of the hard disk 20 and is visually displayed on the screen 31 of the display unit 30.

Referring to FIGS. 5, 6A, and 6B, the description will proceed to operation of the fault simulation method according to the preferred embodiment of this invention.

As shown in FIG. 5. the illustrated fault simulation method is similar in structure and operation to the conventional fault simulation method illustrated in FIG. 2 except that the step S3' is modified into steps S3 and S4 as will later become clear.

At the step S1, the central processing unit 11 assumes or defines internal faults in the entire circuit represented by the gate model to prepare the fault circuits which are equal in number to the internal faults and which are represented by gate models, as shown in FIG. 6A. In the example being illustrated in FIG. 6A, the first and the second internal faults Fi1 and Fi2 are assumed or defined as the internal faults and the central processing unit 11 prepares, as the first and the second fault circuits 51 and 52, the entire circuits which include the first and the second internal faults Fi1 and Fi2, respectively.

The step S1 is followed by the step S2 at which the central processing unit 11 divides each fault circuit into a plurality of partial circuits each of which is represented by the gate model. In the example being illustrated in FIG. 6A, the central processing unit 11 divides each fault circuit into the first and the second partial circuits 61 and 62. In addition, the first fault circuit 51 is the fault circuit where the first internal fault Fi1 is included in the first partial circuit 61 while the second fault circuit 52 is the fault circuit where the second internal fault Fi1 is included in the second partial circuit 62.

The step S2 is succeeded by the step S3 at which the central processing unit 11 replaces the internal faults in the partial circuits with external faults out of the partial circuits that are equivalent to the internal faults, as shown in FIG.6B. In the example being illustrated in FIG. 6B, in a case of the first fault circuit 51, the first internal fault Fi1 in the first partial circuit 61 is replaced with a first external fault Fe1 out of the first partial circuit 61 that is equivalent to the first internal fault Fi1. This is because the first internal fault Fi1 exists in the first partial circuit 61. In addition, in another case of the second fault circuit 52, the second internal fault Fi2 in the second partial circuit 62 is replaced with a second external fault Fe2 out of the second partial circuit 62 that is equivalent to the second internal fault Fi2. This is because the second internal fault Fi2 exists in the second partial circuit 62. In addition, description will later be made as regards definite examples in replacing the internal faults with the external faults in more detail.

The step S3 proceeds to a step S4 at which the central processing unit 11 translates all of the partial circuits into translated partial circuits each of which is represented by the superior model operable at a higher speed than that of the gate model, as shown in FIG. 6B. More specifically, in the example being illustrated in FIG. 6B, in both cases of the first and the second fault circuits 51A and 52A, the first and second partial circuits 61 and 62 are translated into translated first and second partial circuits 61A and 62A each of which is represented by the superior model.

The above-mentioned steps S3 and S4 are new matters in the present invention.

The step S4 proceeds to the step S5 at which the central processing unit 11 carries out simulation on the good circuit (which is the entire circuit having no fault and which is represented by the superior model) and all of the fault circuits to determine whether or not any fault can be detected by comparing among results of simulation. After this processing in the step S5 is repeatedly performed by the number of patterns (step S6), the central processing unit 11 calculates a fault coverage in the entire circuit (step S7).

As described above, it is possible to perform the fault simulation on the entire circuit at high speed. This is because it is possible to perform operation on all of the partial circuits represented by the superior models which are operable at the higher speed than that of the gate models.

Figure 7A:
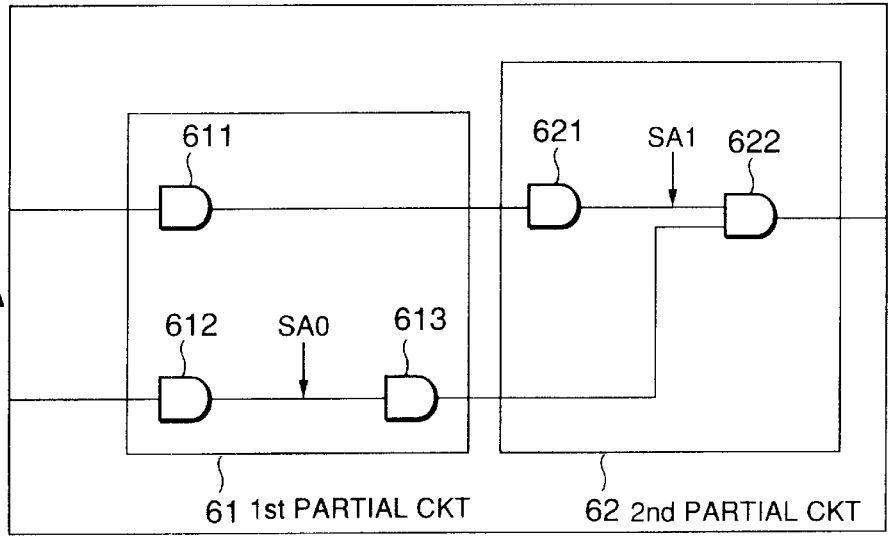
FIG. 7A shows an example in a processed result obtained by processing steps S1 and S2 illustrated in FIG. 5.
Figure 7B:
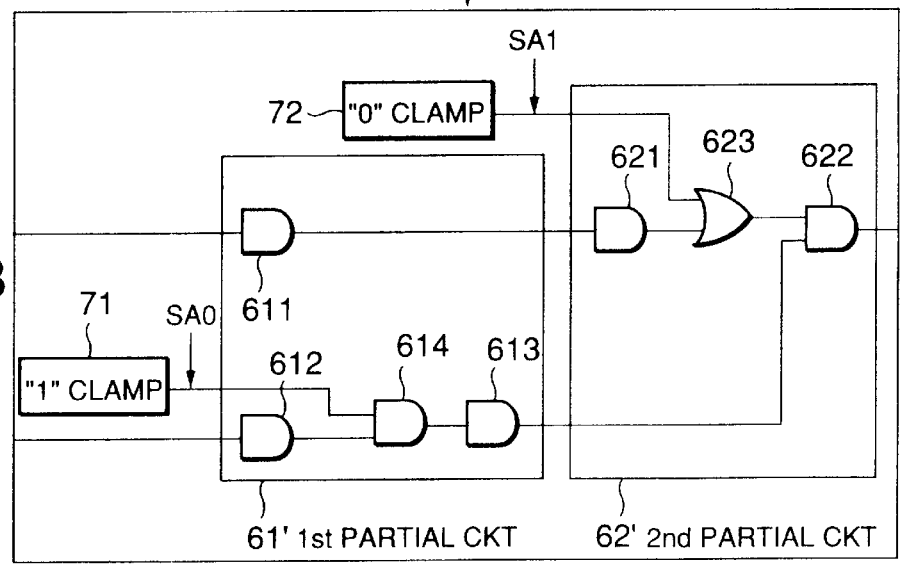
FIG. 7B shows another example in another processed result obtained by processing a step S3 illustrated in FIG. 5.

Turning to FIGS. 7A and 7B, description will be made as regards a first definite example in processing (the step S3 in FIG. 5) of replacing the internal faults in the partial circuits with the external faults out of the partial circuits. FIG. 7A shows an example in a processed result obtained by processing the steps S1 and S2 illustrated in FIG. 5. FIG. 7B shows another example in another processed result obtained by processing the step S3 illustrated in FIG. 5.

In the example being illustrated in FIG. 7A, the entire circuit is divided into the first and the second partial circuits 61 and 62. The first partial circuit 61 comprises first through third gates 611, 612, and 613 while the second partial circuit 62 comprises fourth and fifth gates 621 and 622. In the example being illustrated, it is assumed that the fault are stuck faults. As well known in the art, the stuck faults are classified into a stuck-at-1 fault and a stuck-at-0 fault. The stuck-at-1 fault is a stuck fault where a fault point always has a logic "1" level while the stuck-at-0 fault is a stuck fault where a fault point always has a logic "0" level.

As shown in FIG. 7A, the first partial circuit 61 has, as the first internal fault Fi1 (FIG. 6A), the stuck-at-0 fault SA0 between an output terminal of the second gate 612 and an input terminal of the third gate 613. The entire circuit assumed with the first internal fault Fi1 (the stuck-at-0 fault SA0) is called the first fault circuit, like 51 illustrated in FIG. 6A. In addition, the second partial circuit 62 has, as the second internal fault Fi2 (FIG. 6A), the stuck-at-1 fault SA1 between an output terminal of the fourth gate 621 and an input terminal of the fifth gate 622. The entire circuit assumed with the second internal fault Fi2 (the stuck-at-1 fault SA1) is called the second fault circuit, like 52 illustrated in FIG. 6A.

Attention will be directed to the first fault circuit. As shown in FIG. 7B, the step S3 in FIG. 5 comprises substeps of inserting an AND gate 614 in a first fault point where the first internal fault Fi1 or the stuck-at-0 fault SA0 is assumed or defined, of drawing a first external terminal from one input terminal of the AND gate 614, of connecting the first external terminal with a "1" clamping circuit 71 for producing a signal of a logic "1" level, and of replacing the first internal fault SA0 at the first fault point with the stuck-at-0 fault SA0 for the first external terminal.

In addition, attention will be directed to the second fault circuit. As shown in FIG. 7B, the step S3 in FIG. 5 comprises the substeps of inserting an OR gate 623 in a second fault point where the second internal fault Fi2 or the stuck-at-1 fault SA1 is assumed or defined, of drawing a second external terminal from one input terminal of the OR gate 623, of connecting the second external terminal with a "0" clamping circuit 72 for producing a signal of a logic "0" level, and of replacing the second internal fault SA1 at the second fault point with the stuck-at-1 fault SA1 for the second external terminal.

Inasmuch as each of first and second converted partial circuits 61' and 62' has no internal fault, it is possible to easily translate each of the first and the second converted partial circuits 61A and 62A into a translated partial circuit which is represented by the superior model. The superior model may be C-like description and is of course not restricted to it.

Figure 8A:
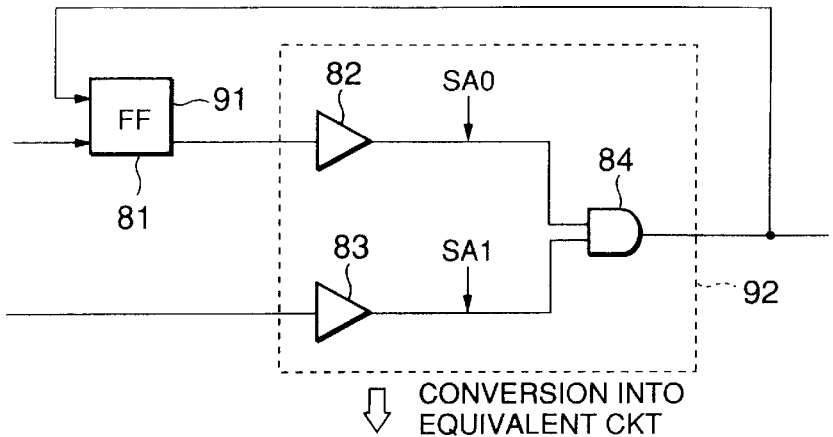
FIG. 8A shows an example in a processed result obtained by processing the steps S1 and S2 illustrated in FIG. 5.
Figure 8B:
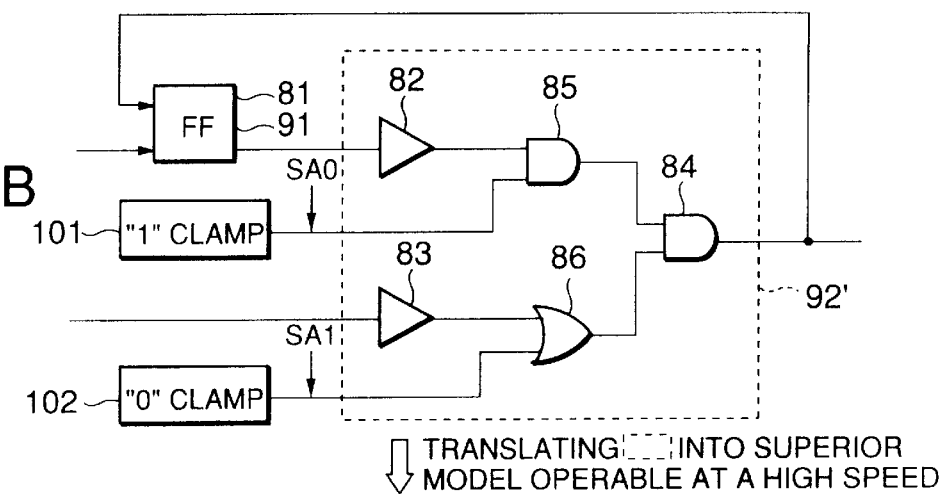
FIG. 8B shows another example in another processed result obtained by processing the step S3 illustrated in FIG. 5.
Figure 8C:
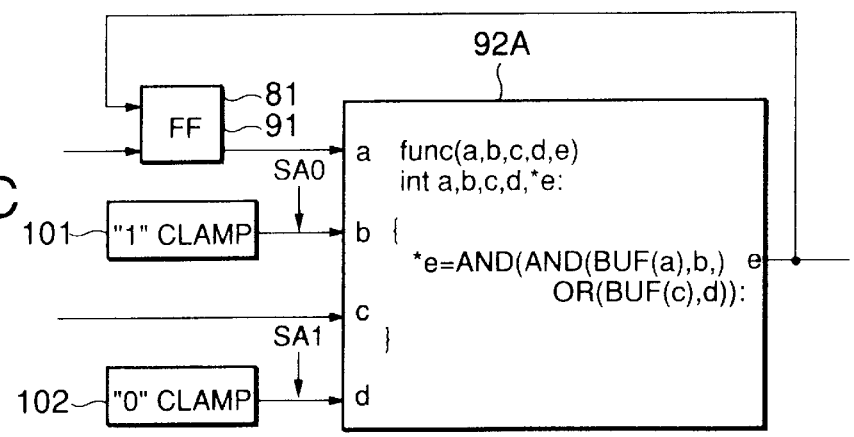
FIG. 8C shows a still another example in a still another processed result obtained by processing a step S4 illustrated in FIG. 5.

Turning to FIGS. 8A, 8B, and 8C, description will be made as regards a second definite example in processing (the step S3 in FIG. 5) of replacing the internal faults in the partial circuits with the external faults out of the partial circuits that are equivalent to the internal faults and in processing (the step S4 in FIG. 5) of replacing all of the partial circuits with another partial circuits each of which is represented by the superior model. FIG. 8A shows an example in a processed result obtained by processing the steps S1 and S2 illustrated in FIG. 5. FIG. 8B shows another example in another processed result obtained by processing the step S3 illustrated in FIG. 5. FIG. 8C shows a still another example in a still another processed result obtained by processing the step S4 illustrated in FIG. 5.

In the example being illustrated in FIG. 8A, an entire circuit comprises a flip-flop circuit 81, first and second buffer circuits 82 and 83, and an AND gate 84. In addition, a stuck-at-0 fault SA0 is assumed or defined at an output terminal of the first buffer circuit 82 while a stuck-at-1 fault SA1 is assumed or defined at an output terminal of the second buffer circuit 83. In the example being illustrated, the entire circuit is divided into a first partial circuit 91 consisting of the flip-flop circuit 81 and a second partial circuit 92 which consists of the first and the second buffer circuits 82 and 83 and the AND gate 84.

As shown in FIG. 8B, the second partial circuit 92 is converted into a second converted partial circuit 92' which is equivalent to the second partial circuit 92. More specifically, an AND gate 85 is inserted in a first fault point where the stuck-at-0 fault SA0 is assumed or defined, a first external terminal is drawn from one input terminal of the AND gate 85, the first external terminal is connected with a "1" clamping circuit 101 for producing a signal of a logic "1" level, and the first internal fault SA0 at the first fault point is replaced with the stuck-at-0 fault SA0 for the first external terminal. In addition, an OR gate 86 is inserted in a second fault point where the stuck-at-1 fault SA1 is assumed or defined, a second external terminal is drawn from one input terminal of the OR gate 86, the second external terminal is connected with a "0" clamping circuit 102 for producing a signal of a logic "0" level, and the second internal fault SA1 at the second fault point is replaced with the stuck-at-1 fault SA1 for the second external terminal.

As shown in FIG. 8C, all of the partial circuits are translated into translated partial circuits each of which is represented by the superior model operable at a higher speed than that of the gate model. In the example being illustrated, the C-like description is used as the superior model. That is, the second converted partial circuit 92' represented by the gate model is translated into a second translated partial circuit 92A represented by the C-like description. In the second translated partial circuit 92A, a reference sign of "a" represents an input of the first buffer circuit 82 or an output of the flip-flop circuit 91, a reference sign of "b" represents an input of the AND gate 85 or an output of the "1" clamping circuit 101, a reference sign of "c" represents an input of the second buffer circuit 83, and a reference sign of "d" represents an input of the OR gate 86 or an output of the "0" clamping circuit 102. In addition, a reference sign of "e" represents an output of the second partial circuit 92A (92B) or an input of the flip-flop 81.

While this invention has thus far been described in conjunction with a preferred embodiment thereof, it will now be readily possible for those skilled in the art to put this invention into various other manners. For example, the superior model may be any model operable at a higher speed than that of the gate model although the C-like description is used as the superior model in the above-mentioned embodiment. At any rate, the superior model is operable at high speed by logic simulation. In addition, the fault is not restricted to the stuck fault, and the fault may therefore be any fault which is drawn out of the partial circuit. Furthermore, the fault simulator or the program realizing the above-mentioned fault simulation method may be recorded in a recording medium 110 as shown at a broken line in FIG. 4. Herein, the "recording medium" means a recording medium for recording the program which enables the computer 10 to read. For example, the recording medium may be a compact disc read-only memory (CD-ROM), a magnetic disk such as a floppy or flexible disk, a semiconductor memory, or the like. At any rate, such a program is installed from the recording medium 110 in the computer 10.

What is claimed is:

1. A method for fault simulation comprising:
   a first step of preparing a plurality of fault circuits represented by gate models, which are equal in number to the number of internal faults, with the internal faults assumed in an entire circuit represented by said gate model;
   a second step of dividing each of the fault circuits represented by said gate models into a plurality of partial circuits each of which is represented by said gate model;
   a third step of replacing internal faults in the partial circuits represented by said gate models with external faults out of the partial circuits that are equivalent to the internal faults;
   a fourth step of translating the partial circuits represented by said gate models into translated partial circuits represented by superior models which have an operation speed faster than said gate models;
   a fifth step of simultaneously simulating circuits including circuits without internal faults and circuits having said translated partial circuits represented by said superior models that correspond to the partial circuits having the internal faults replaced with said external faults, said simulating determining whether the internal faults can be detected; and
   a sixth step of outputting data indicative of whether said internal faults can be detected.

2. A method for fault simulation as claimed in claim 1, wherein the method further comprises a seventh step of calculating a fault coverage for said entire circuit by repeating said fifth step.

3. A method for fault simulation as claimed in claim 1, wherein said internal faults are stuck faults.

4. A method for fault simulation as claimed in claim 3, wherein when a particular one of said stuck faults is a stuck-at-0 fault where a fault point always has a logic "0" level, said third step comprises the substeps of:

inserting an AND gate in the fault point;

drawing an external terminal from one input terminal of said AND gate;

connecting the external terminal with a "1" clamping circuit for producing a signal of a logic "1" level; and replacing the stuck-at-0 fault at the fault point with the stuck-at-0 fault for said external terminal.

5. A method for fault simulation as claimed in claim 3, wherein when a particular one of said stuck faults is a stuck-at-1 fault where a fault point always has a logic "1" level, said third step comprises the substeps of:

inserting an OR gate in the fault point;

drawing an external terminal from one input terminal of said OR gate;

connecting the external terminal with a "0" clamping circuit for producing a signal of a logic "0" level; and replacing the stuck-at-1 at the fault point with the stuck-at-1 fault for said external terminal.

6. A method for fault simulation as claimed in claim 1, wherein said outputting comprises storing said data indicative of whether said internal faults can be detected in a storage device.

7. A method for fault simulation as claimed in claim 1, wherein said outputting comprises displaying said data indicative of whether said internal faults can be detected.

8. A recording medium for recording a program to make a computer execute fault simulation for an entire circuit, said recording medium recording the program to make said computer execute:

a first processing of preparing a plurality of fault circuits represented by gate models, which are equal in number to the number of faults, with the faults assumed in the entire circuit represented by the gate model;

a second processing of dividing each of the fault circuits represented by said gate models into a plurality of partial circuits each of which is represented by said gate model;

a third processing of replacing internal faults in the partial circuits represented by said gate models with external faults out of the partial circuits that are equivalent to the internal faults;

a fourth processing of translating the partial circuits represented by said gate models into translated partial circuits represented by superior models which have an operation speed faster than said gate models;

a fifth processing of simultaneously simulating circuits including circuits without internal faults and circuits having said translated partial circuits represented by said superior models that correspond to the partial circuits having the internal faults replaced with said external faults, said simulating determining whether the faults can be detected; and a sixth processing of outputting data indicative of whether said internal faults can be detected.

9. A recording medium as claimed in claim 8, wherein said recording medium further makes the computer execute a seventh processing of calculating a fault coverage for said entire circuit by repeating said fifth processing.

10. A recording medium as claimed in claim 8, wherein said faults are stuck faults.

11. A recording medium as claimed in claim 10, wherein when a particular one of said stuck faults is a stuck-at-0 fault where a fault point always has a logic "0" level, said third processing comprises the supprocessing of:

inserting an AND gate in the fault point;

drawing an external terminal from one input terminal of said AND gate;

connecting the external terminal with a "1" clamping circuit for producing a signal of a logic "1" level; and replacing the stuck-at-0 at the fault point with the stuck-at-0 fault for said external terminal.

12. A recording medium as claimed in claim 10, wherein when a particular one of said stuck faults is a stuck-at-1 fault where a fault point always has a logic "1" level, said third processing comprises the supprocessings of:

inserting an OR gate in the fault point;

drawing an external terminal from one input terminal of said OR gate;

connecting the external terminal with a "0" clamping circuit for producing a signal of a logic "0" level; and replacing the stuck-at-1 at the fault point with the stuck-at-1 fault for said external terminal.

13. A recording medium as claimed in claim 8, wherein said sixth processing comprises storing said data indicative of whether said internal faults can be detected in a storage device.

14. A recording medium as claimed in claim 8, wherein said sixth processing comprises displaying said data indicative of whether said internal faults can be detected.

* * * * *